(12) United States Patent
Baek et al.

(10) Patent No.: US 9,312,810 B2
(45) Date of Patent: Apr. 12, 2016

(54) COMPLEMENTARY COLPITTS VOLTAGE CONTROLLED OSCILLATOR WITH LOW POWER AND LOW PHASE NOISE

(71) Applicant: CHUNG-ANG UNIVERSITY INDUSTRY-ACADEMY COOPERATION FOUNDATION, Seoul (KR)

(72) Inventors: Dong-Hyun Baek, Seoul (KR); Keum-Won Ha, Gwangju (KR); Hyuk Ryu, Seoul (KR); Jin-Hyeon Lee, Cheonan (KR); Jeong-Geun Kim, Seoul (KR)

(73) Assignee: Chung-Ang University Industry-Academy Cooperation Foundation, Seoul (KR)

( * ) Notice: Subject to any disclaimer, the term of this patent is extended or adjusted under 35 U.S.C. 154(b) by 0 days.

(21) Appl. No.: 14/583,731

(22) Filed: Dec. 28, 2014

(65) Prior Publication Data
US 2015/0244319 A1    Aug. 27, 2015

(30) Foreign Application Priority Data
Dec. 31, 2013   (KR) .................. 10-2013-0168599

(51) Int. Cl.
*H03B 5/12* (2006.01)

(52) U.S. Cl.
CPC ............ *H03B 5/1225* (2013.01); *H03B 5/1228* (2013.01); *H03B 5/1243* (2013.01); *H03B 5/1296* (2013.01); *H03B 2200/0008* (2013.01)

(58) Field of Classification Search
CPC .. H03B 5/1218; H03B 5/1206; H03B 5/1221; H03B 5/1228; H03B 5/1296; H03B 2200/0008
USPC ........................................ 331/117 R, 117 FE
See application file for complete search history.

(56) References Cited

U.S. PATENT DOCUMENTS

| | | | | |
|---|---|---|---|---|
| 3,346,821 A * | 10/1967 | Swyryd | ................ | H03B 5/1231 331/113 A |
| 7,411,468 B2 * | 8/2008 | Luong | .................. | H03B 5/1228 331/117 R |
| 7,420,429 B2 * | 9/2008 | Cha | ...................... | H03B 5/1212 331/108 A |
| 7,545,230 B2 * | 6/2009 | Jang | ...................... | H03B 5/1228 331/117 FE |
| 7,839,229 B2 * | 11/2010 | Nakamura | ........... | H03B 5/1228 331/117 R |
| 8,212,625 B2 * | 7/2012 | Lee | ....................... | H03B 5/1228 331/117 FE |

(Continued)

FOREIGN PATENT DOCUMENTS

KR   10-0757856 B1   9/2007

*Primary Examiner* — Ryan Johnson
(74) *Attorney, Agent, or Firm* — Mintz Levin Cohn Ferris Glovsky and Popeo, P.C.; Kongsik Kim; Jonathon Western

(57) ABSTRACT

A complementary Colpitts voltage-controlled oscillator having the properties of low power and low phase noise are disclosed. The disclosed complementary Colpitts voltage-controlled oscillator includes: a first circuit composed as a PMOS Colpitts voltage-controlled oscillator having a first PMOS transistor, a first current source, a first capacitor, a second capacitor, and a first inductor but with the first inductor removed; a second circuit composed as an NMOS Colpitts voltage-controlled oscillator having a first NMOS transistor, a second current source, a third capacitor, a fourth capacitor, and a second inductor but with the second inductor removed; and a first transformer and a second transformer arranged between the first circuit and the second circuit.

5 Claims, 9 Drawing Sheets

(56) References Cited

U.S. PATENT DOCUMENTS

| | | | | |
|---|---|---|---|---|
| 8,729,970 B2 * | 5/2014 | Kawasaki | ............ | H03B 5/1231 331/107 R |
| 8,957,739 B2 * | 2/2015 | Lu | ............................ | H03B 1/00 331/117 FE |
| 2014/0320215 A1 * | 10/2014 | Staszewski | ........ | H03H 11/0405 331/18 |

* cited by examiner

COMPLEMENTARY COLPITTS VOLTAGE CONTROLLED OSCILLATOR WITH LOW POWER AND LOW PHASE NOISE

CROSS-REFERENCE TO RELATED APPLICATION

This application claims priority to Korean Application No. 10-2013-0168599 filed on Dec. 31, 2013, which is incorporated herein by reference.

TECHNICAL FIELD

The embodiments of the present invention relate to a Colpitts voltage-controlled oscillator, more particularly to a complementary Colpitts voltage-controlled oscillator having the properties of low power and low phase noise.

BACKGROUND ART

A voltage-controlled oscillator (VCO) refers to a device that generates a desired frequency signal by altering a voltage applied from the outside, and is mainly used for wireless communication in analog sound mixing devices, mobile communication terminals, and the like.

FIG. 1A and FIG. 1B are circuit diagrams illustrating Colpitts voltage-controlled oscillators according to the related art.

A Colpitts voltage-controlled oscillator according to the related art, as illustrated in FIG. 1A and FIG. 1B, may be a PMOS Colpitts voltage-controlled oscillator (FIG. 1A) or an NMOS Colpitts voltage-controlled oscillator (FIG. 1B), each of which may include a MOS transistor Q, two capacitors C1, C2, an inductor L, and a current source IB for biasing.

A conventional Colpitts voltage-controlled oscillator may have cyclostationary statistic properties, and may have a low phase noise property due to its inherent resistance to flicker and thermal noises of active components.

However, the conventional Colpitts voltage-controlled oscillator may entail the drawback or requiring a relatively larger amount of current for generating the same negative Gm compared to a differential cross-coupled oscillator. Thus, there is a need for the development of a Colpitts voltage-controlled oscillator having improved power and phase noise properties.

SUMMARY

To resolve the problems described above, an aspect of the invention aims to provide a complementary Colpitts voltage-controlled oscillator having low power and low phase noise properties.

Other objectives of the invention can be derived by those skilled in the art from the embodiments described herein.

To achieve the objective above, an embodiment of the invention provides a complementary Colpitts voltage-controlled oscillator that includes: a first circuit composed as a PMOS Colpitts voltage-controlled oscillator having a first PMOS transistor, a first current source, a first capacitor, a second capacitor, and a first inductor but with the first inductor removed; a second circuit composed as an NMOS Colpitts voltage-controlled oscillator having a first NMOS transistor, a second current source, a third capacitor, a fourth capacitor, and a second inductor but with the second inductor removed; and a first transformer and a second transformer arranged between the first circuit and the second circuit.

One end of the primary winding of the first transformer may be connected with a gate electrode of the first PMOS transistor; one end of the secondary winding of the first transformer may be connected with a drain electrode of the first PMOS transistor; the other end of the primary winding of the first transformer and the other end of the secondary winding of the first transformer may be connected with node A, which corresponds to an AC ground; one end of the primary winding of the second transformer may be connected with a gate electrode of the first NMOS transistor; one end of the secondary winding of the second transformer may be connected with a drain electrode of the first NMOS transistor; and the other end of the primary winding of the second transformer and the other end of the secondary winding of the second transformer may be connected with node A.

The input end of the first current source may be connected with one end of the first capacitor; the output end of the first current source may be connected with a source electrode of the first PMOS transistor, the other end of the first capacitor, and one end of the second capacitor; the other end of the second capacitor may be connected with the drain electrode of the first PMOS transistor and the one end of the secondary winding of the first transformer; the input end of the second current source may be connected with a source electrode of the first NMOS transistor, the other end of the third capacitor, and one end of the fourth capacitor; the output end of the second current source may be connected with the other end of the fourth capacitor; and one end of the third capacitor may be connected with a drain electrode of the first NMOS transistor and the other end of the secondary winding of the second transformer.

The first current source may be composed as a second PMOS transistor, with a source electrode of the second PMOS transistor corresponding to the input end of the first current source, and a drain electrode of the second PMOS transistor corresponding to the output end of the first current source, a gate electrode of the second PMOS transistor may be connected with node A, while the second current source may be composed as a second NMOS transistor, with a drain electrode of the second NMOS transistor corresponding to the input end of the second current source, and a source electrode of the second PMOS transistor corresponding to the output end of the second current source, and a gate electrode of the second NMOS transistor may be connected with node A.

Another embodiment of the invention provides a Colpitts voltage-controlled oscillator that includes: a first PMOS transistor and a first NMOS transistor connected complementarily; a first transformer having one end of its primary winding connected with a gate electrode of the first PMOS transistor, having one end of its secondary winding connected with a drain electrode of the first PMOS transistor, and having the other end of its primary winding thereof the other end of its secondary winding connected with node A, which corresponds to an AC ground; a second transformer having one end of its primary winding connected with a gate electrode of the first NMOS transistor, having one end of its secondary winding connected with a drain electrode of the first NMOS transistor, and having the other end of its primary winding and the other end of its secondary winding connected with node A.

A complementary Colpitts voltage-controlled oscillator according to an embodiment of the invention can provide the advantages of low power and low phase noise properties.

Additional aspects and advantages of the present invention will be set forth in part in the description which follows, and in part will be obvious from the description, or may be learned by practice of the invention.

DETAILED DESCRIPTION

Figure 1A:
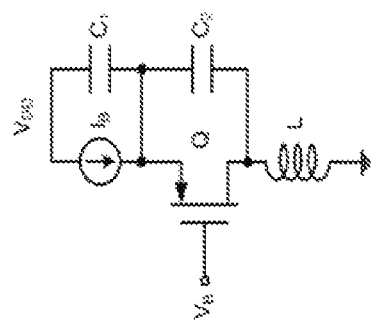
FIG. 1A and FIG. 1B are circuit diagrams illustrating Colpitts voltage-controlled oscillators according to the related art.

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In describing the drawings, like reference numerals are used for like elements.

When an element is mentioned to be "connected" or "joined" to another element, this may mean that it is directly connected or joined to the other element, but it is to be understood that yet another element may exist in-between. On the other hand, when a component is mentioned to be "directly connected" or "directly joined" to another element, it is to be understood that there are no other elements in-between.

Certain embodiments of the invention will be described below in more detail with reference to the accompanying drawings.

Figure 2:
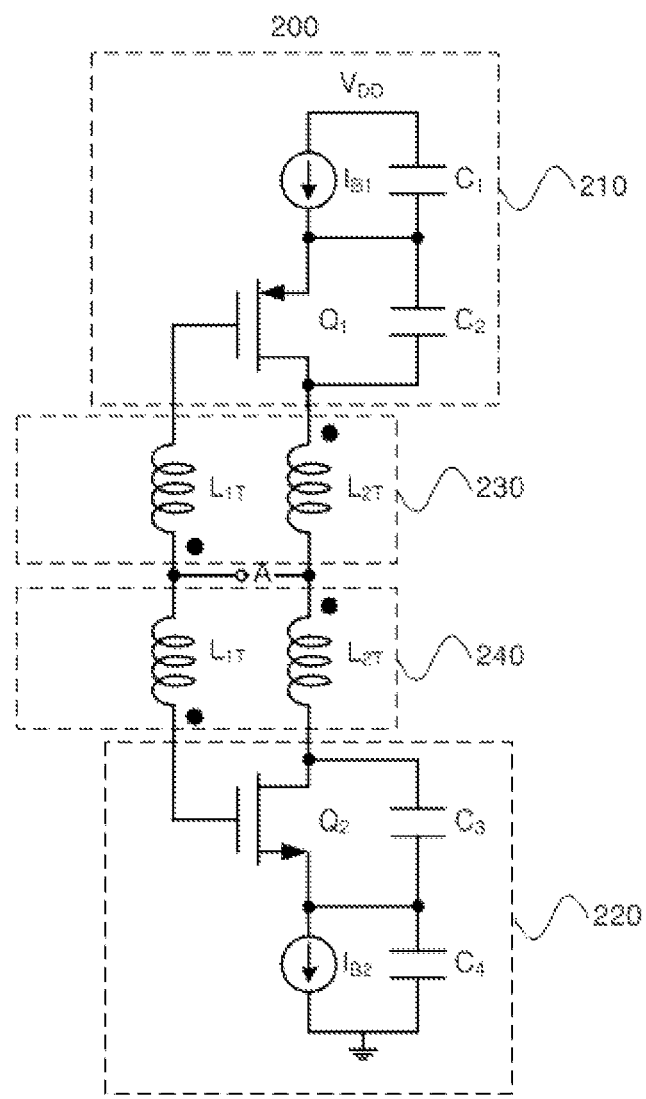
FIG. 2 and FIG. 3 are circuit diagrams illustrating a complementary Colpitts voltage-controlled oscillator according to an embodiment of the invention.

FIG. 2 is a circuit diagram illustrating a complementary Colpitts voltage-controlled oscillator according to an embodiment of the invention.

Referring to FIG. 2, a complementary Colpitts voltage-controlled oscillator 200 according to an embodiment of the invention may include a first PMOS transistor Q1, a first NMOS transistor Q2, four capacitors C1, C2, C3, C4, two current sources IB1, IB2, a first transformer 230, and a second transformer 240.

That is, the complementary Colpitts voltage-controlled oscillator 200 may include a first circuit 210, a second circuit 220, a first transformer 230, and a second transformer 240. Here, the first circuit 210 may be a circuit composed as a conventional PMOS Colpitts voltage-controlled oscillator that includes a first PMOS transistor Q1, a first current source IB1, a first capacitor C1, a second capacitor C2, and a first inductor, from which the first inductor is removed; the second circuit 220 may be a circuit composed as a conventional NMOS Colpitts voltage-controlled oscillator that includes a first NMOS transistor Q2, a second current source IB2, a third capacitor C3, a fourth capacitor C4, and a second inductor, from which the second inductor is removed.

The connections of the complementary Colpitts voltage-controlled oscillator 200 are described below.

The PMOS transistor Q1 and the NMOS transistor Q2 may be connected complementarily.

One end of the primary winding L1T of the first transformer 230 may be connected with a gate electrode of the first PMOS transistor Q1, and one end of the secondary winding L2T of the first transformer 230 may be connected with a drain electrode of the first PMOS transistor Q1, while the other end of the primary winding UT of the first transformer 230 and the other end of the secondary winding L2T of the first transformer 230 may be connected with node A, which corresponds to an AC (alternating current) ground.

One end of the primary winding UT of the second transformer 240 may be connected with the gate electrode of the first NMOS transistor Q2, and one end of the secondary winding L2T of the second transformer 240 may be connected with the drain electrode of the first NMOS transistor Q2, while the other end of the primary winding L1T of the second transformer 240 and the other end of the secondary winding L2T of the second transformer 240 may be connected with node A.

The input end of the first current source IB1 may be connected with one end of the first capacitor C1; the output end of the first current source IB1 may be connected with the source electrode of the first PMOS transistor Q1, the other end of the first capacitor C1, and one end of the second capacitor C2; and the other end of the second capacitor C2 may be connected with the drain electrode of the first PMOS transistor Q1 and one end of the secondary winding L2T of the first transformer 230.

The input end of the second current source IB2 may be connected with the source electrode of the first NMOS transistor Q2, the other end of the third capacitor C3, and one end of the fourth capacitor C4; the output end of the second current source IB2 may be connected with the other end of the fourth capacitor C4; and one end of the third capacitor C3 may be connected with the drain electrode of the first NMOS transistor Q2 and the other end of the secondary winding L2T of the second transformer 240.

Figure 3:
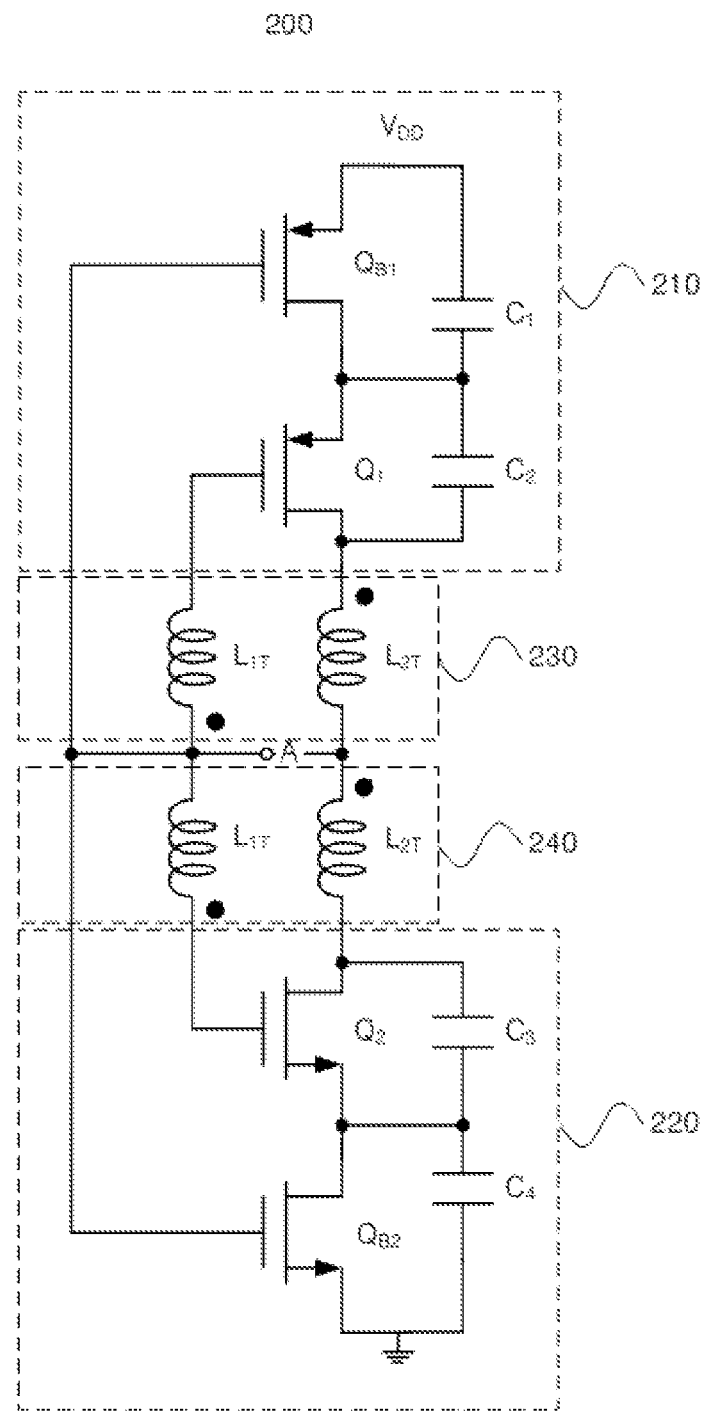

The first current source IB1 and the second current source IB2 can each be implemented as a transistor, as illustrated in FIG. 3.

Referring to FIG. 3, the first current source IB1 may be composed as a second PMOS transistor QB1, where the source electrode of the second PMOS transistor QB1 may correspond to the input end of the first current source IB1, the drain electrode of the second PMOS transistor QB1 may correspond to the output end of the first current source IB1, and the gate electrode of the second PMOS transistor QB1 may be connected with node A.

Also, the second current source IB2 may be composed as a second NMOS transistor QB2, where the drain electrode of the second NMOS transistor QB2 may correspond to the input end of the second current source IB2, the source electrode of the second NMOS transistor QB2 may correspond to the output end of the second current source IB2, and the gate electrode of the second NMOS transistor QB2 may be connected with node A.

The forming of the complementary Colpitts voltage-controlled oscillator 200 according to an embodiment of the invention will be described below in more detail with reference to FIG. 4A and FIG. 4B.

Figure 4A:
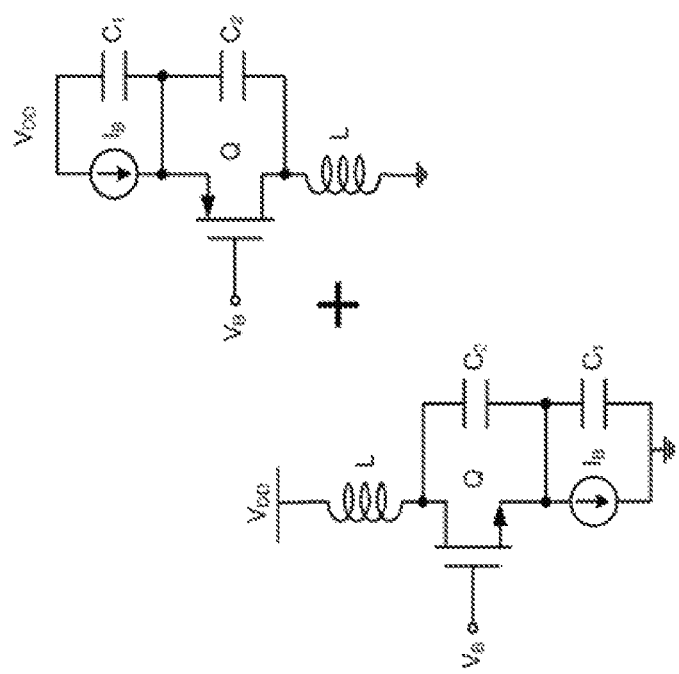
FIG. 4A and FIG. 4B are diagrams illustrating the need for forming the complementary Colpitts voltage-controlled oscillator of FIG. 2.
Figure 4B:
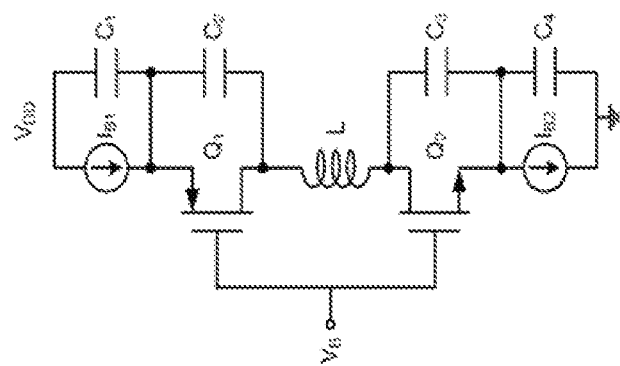

FIG. 4A and FIG. 4B are diagrams illustrating the need for forming the complementary Colpitts voltage-controlled oscillator 200 of FIG. 2.

Figure 1B:
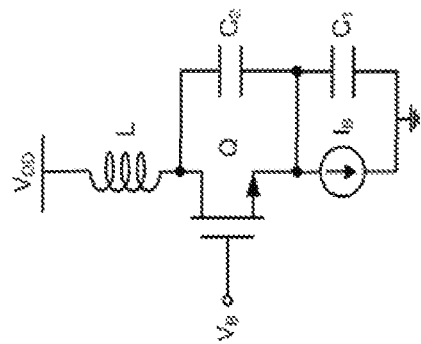

As described above for FIG. 1A and FIG. 1B, a conventional PMOS Colpitts voltage-controlled oscillator and a NMOS Colpitts voltage-controlled oscillator may each be composed of a PMOS/NMOS transistor Q, a current source IB, two transistors C1, C2, and an inductor L.

Here, by having a PMOS Colpitts voltage-controlled oscillator and a NMOS Colpitts voltage-controlled oscillator, such as those illustrated in FIG. 4A, share an inductor L, a conventional complementary Colpitts voltage-controlled oscillator may be formed, as illustrated in FIG. 4B. However, in the case of a conventional complementary Colpitts voltage-controlled oscillator, such as that illustrated in FIG. 4B, there is the problem that three biases VB, IB1, IB2 are added.

Thus, to resolve this problem, a complementary Colpitts voltage-controlled oscillator 200 based on an embodiment of the invention, such as that shown in FIG. 2, may be used.

That is, in the case of a complementary Colpitts voltage-controlled oscillator 200 based on an embodiment of the invention shown in FIG. 2, there is no voltage (i.e. VB) applied to the gate electrodes of the PMOS transistor and NMOS transistor, and self-biasing is performed due to the mutually connected first transformer 230 and second transformer 240, thereby reducing the applied bias.

To be more specific, the node A where the first transformer 230 and the second transformer 240 are connected can be regarded as a ground from the perspective of AC, but from the perspective of DC, a DC voltage of several mV (e.g. about 40-50 mV) may be applied, with the DC voltage of node A enabling self-biasing.

Also, as the DC voltage of node A is changed in real time, any mismatch in Gm (Gmp≠Gmn) can be compensated. Here, the DC voltage of node A may be determined by the point at which the Gm of the PMOS transistor (Gmp) and the Gm of the NMOS transistor (Gmn) become the same.

Also, as illustrated in FIG. 3, the first current source IB1 and the second current source IB2 can be composed as MOS transistors, and in this case, there is the advantage that it is not necessary to apply three gate biases.

In short, in a complementary Colpitts voltage-controlled oscillator 200 according to an embodiment of the invention, the inductors connected to the drain electrodes of the PMOS transistor and NMOS transistor can be replaced with two transformers, and by allowing self-biasing using the DC voltage at node A where the first transformer 230 and second transformer 240 meet, it is possible to reduce the applied bias.

Figure 5:
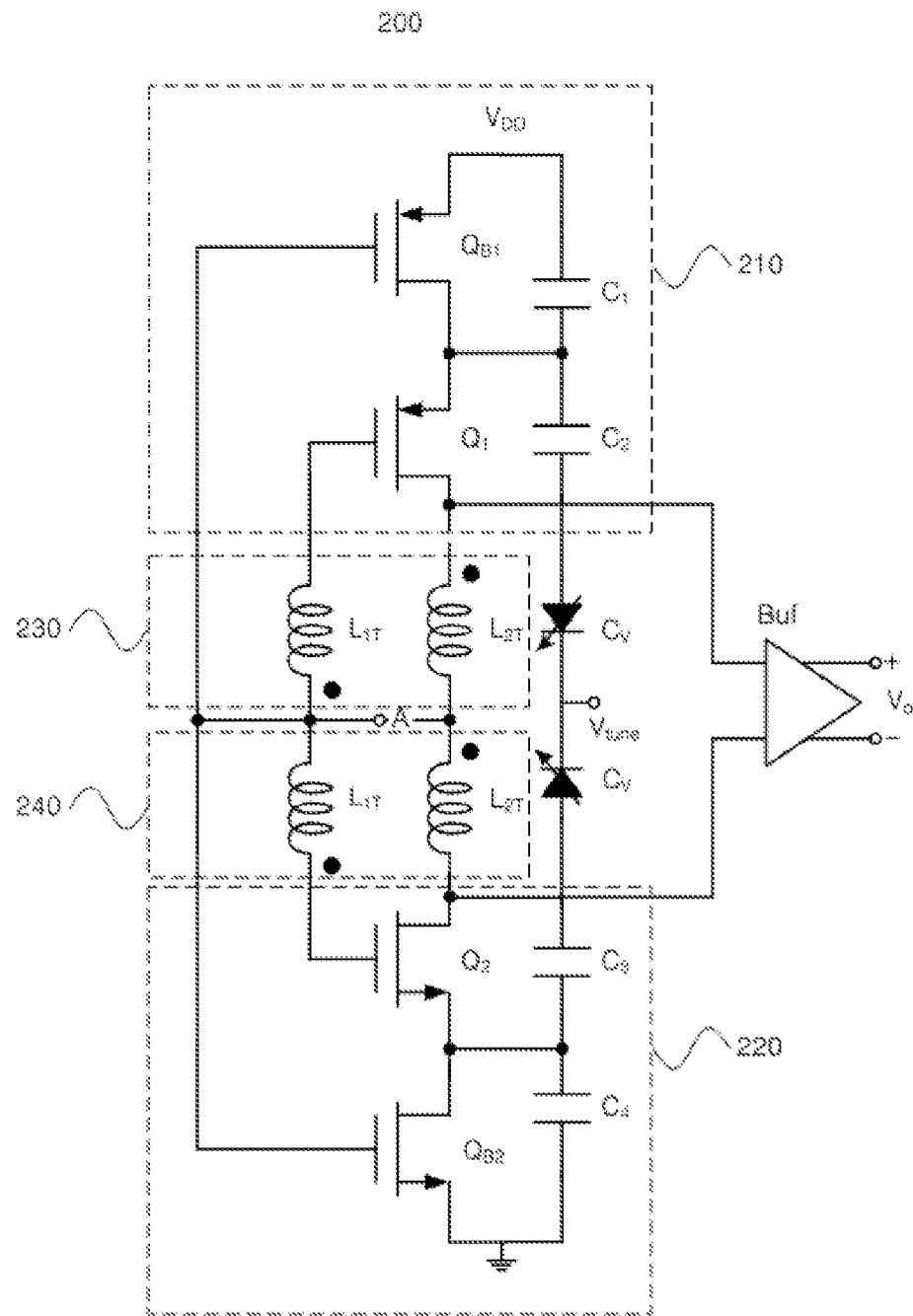
FIG. 5 illustrates a circuit composition in which a varactor for frequency tuning and an output buffer are added to the diagram of FIG. 3.
Figure 6:
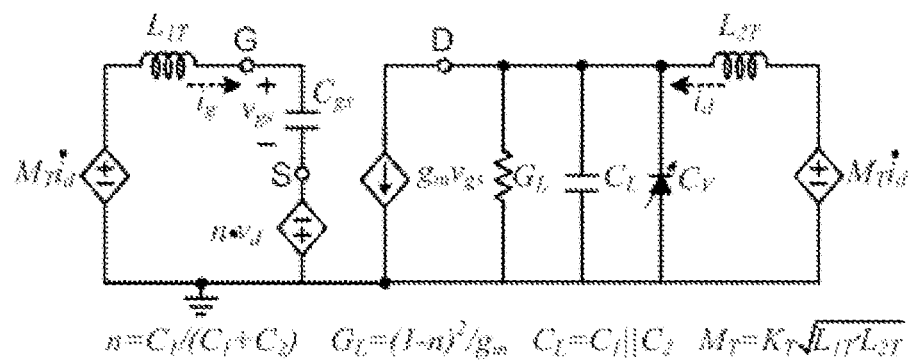
FIG. 6 illustrates a half equivalent circuit of the circuit shown in FIG. 5.

FIG. 5 illustrates a circuit composition in which a varactor for frequency tuning and an output buffer are added to the diagram of FIG. 3, and FIG. 6 illustrates a half equivalent circuit of the circuit shown in FIG. 5 (i.e. an equivalent circuit of the top half or bottom half with respect to node A).

First, referring to FIG. 6, the output voltage may be generated according to the amount of change in the current flowing through the inductor L2T corresponding to the secondary winding L2T of the transformers 230, 240, and this may be expressed as Equation 1 shown below.

$$v_{out} = L_{2T} \frac{\partial i_d}{\partial t} - \frac{\partial i_d}{\partial t} = \frac{v_{out}}{L_{2T}} \quad \text{[Equation 1]}$$

Here, the drain electrode of the PMOS transistor or NMOS transistor may be the output node, and this may be expressed as Equation 2 shown below.

$$v_0 = v_d \quad \text{[Equation 2]}$$

There is no current entering the gate electrode of the MOS transistor, so that there is no voltage occurring at the inductor UT corresponding to the primary winding of the transformer 230, 240, and Vgs may be applied to the gate electrode. This may be expressed as Equation 3 shown below.

$$v_{gs} = M_T \cdot \frac{\partial i_d}{\partial t}\bigg|n \cdot v_d = M_T \cdot \frac{v_{out}}{L_{2T}}\bigg|n \cdot v_0 = \left(K_T \sqrt{\frac{L_{2T}}{L_{2T}}} \; |n\right) \quad \text{[Equation 3]}$$

Here, gmVgs is the "amount of current supplied", and by substituting Equation 3 into Vgs, the following Equation 4 can be obtained.

$$g_m \cdot v_{gs} = g_m \cdot \left(n + K_T \sqrt{\frac{L_{2T}}{L_{2T}}} \cdot v_0\right) \quad \text{[Equation 4]}$$

A complementary Colpitts voltage-controlled oscillator 200 according to an embodiment of the invention may have a negative Gm property, and this can be generated from two feedbacks. One is the feedback from the two capacitors C1, C2 (capacitive feedback), and the other is magnetic coupling using a transformer. Since the impedance of Cgs is greater than the impedance of L2T, Vgs may be determined by the impedance dividing ratio of the feedback voltage and feedback current as shown in Equation 5 below.

$$v_{gs} = -nv_d + M_T i_d \quad \text{[Equation 5]}$$

Since the gate current ig is very small, the total negative Gm of the half equivalent circuit can be expressed as Equation 6 shown below.

$$g_{m,T} = -g_m\left(n + K_T \sqrt{\frac{L_{2T}}{L_{2T}}}\right) \cdot g_m = g_{m,n} = g_{m,p} \quad \text{[Equation 6]}$$

Comparing Equation 4 with Equation 6, it can be seen that the terms on the right are similar.

Also, the negative Gm may be boosted by the mutual coupling factor of the transformers, and the gate inductance may be made greater than the drain inductance in order to maximize the negative Gm. Thus, the improved negative Gm can reduce the power consumption of the complementary Colpitts voltage-controlled oscillator 200. The oscillating frequency of the Colpitts voltage-controlled oscillator 200 may be determined mainly by the resonating frequency of the drain, and this may be expressed as Equation 7 shown below.

$$f_{osc} \simeq \frac{1}{2\pi \sqrt{L_{2T} \cdot (C_1 \| C_2 + C_v)}} \quad \text{[Equation 7]}$$

Figure 7:
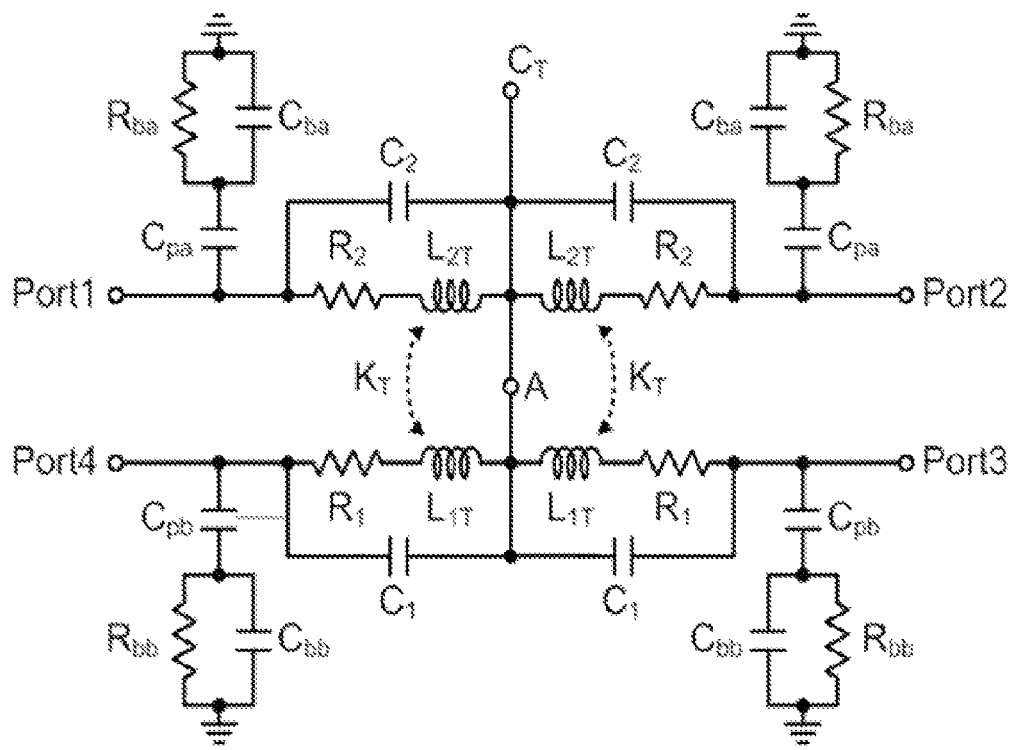
FIG. 7 illustrates a circuit composition modeling the first transformer and the second transformer.

FIG. 7 illustrates a circuit composition modeling the first transformer 230 and the second transformer 240. Here, Port1 represents the drain electrode of the first PMOS transistor Q1, Port2 represents the drain electrode of the first NMOS transistor Q2, Port3 represents the gate electrode of the first PMOS transistor Q1, and Port4 represents the gate electrode of the first NMOS transistor Q2.

In summary, a complementary Colpitts voltage-controlled oscillator 200 according to an embodiment of the invention can have two transformers in place of the inductors that are connected to the drain electrodes of the PMOS transistor and NMOS transistor. This enables self-biasing for a reduced bias, and also allows a compensation for any mismatch in Gm (Gmp≠Gmn).

While the present invention has been described above using particular examples, including specific elements, by way of limited embodiments and drawings, it is to be appreciated that these are provided merely to aid the overall understanding of the present invention, the present invention is not to be limited to the embodiments above, and various modifications and alterations can be made from the disclosures above by a person having ordinary skill in the technical field to which the present invention pertains. Therefore, the spirit of the present invention must not be limited to the embodiments described herein, and the scope of the present invention must be regarded as encompassing not only the claims set forth below, but also their equivalents and variations.

The invention claimed is:

1. A complementary Colpitts voltage-controlled oscillator comprising:
   a first circuit having a first PMOS transistor, a first current source, a first capacitor, and a second capacitor;
   a second circuit having a first NMOS transistor, a second current source, a third capacitor, and a fourth capacitor; and
   a first transformer and a second transformer arranged between the first circuit and the second circuit,
   wherein one end of a primary winding of the first transformer is connected with a gate electrode of the first PMOS transistor; one end of a secondary winding of the first transformer is connected with a drain electrode of the first PMOS transistor; the other end of the primary winding of the first transformer and the other end of the secondary winding of the first transformer are connected with a node A corresponding to an AC ground; and
   wherein one end of a primary winding of the second transformer is connected with a gate electrode of the first NMOS transistor; one end of a secondary winding of the second transformer is connected with a drain electrode of the first NMOS transistor; and the other end of the primary winding of the second transformer and the other end of the secondary winding of the second transformer are connected with the node A.

2. The complementary Colpitts voltage-controlled oscillator of claim 1, wherein an input end of the first current source is connected with one end of the first capacitor; an output end of the first current source is connected with a source electrode of the first PMOS transistor, the other end of the first capacitor, and one end of the second capacitor; the other end of the second capacitor is connected with the drain electrode of the first PMOS transistor and the one end of the secondary winding of the first transformer; and
   wherein one end of the third capacitor is connected with a drain electrode of the first NMOS transistor and the one end of the secondary winding of the second transformer; an input end of the second current source is connected with a source electrode of the first NMOS transistor, the other end of the third capacitor, and one end of the fourth capacitor; an output end of the second current source is connected with the other end of the fourth capacitor; and one end of the third capacitor is connected with a drain electrode of the first NMOS transistor and the other end of the secondary winding of the second transformer.

3. The complementary Colpitts voltage-controlled oscillator of claim 2, wherein the first current source is composed as a second PMOS transistor, a source electrode of the second PMOS transistor corresponds to an input end of the first current source, a drain electrode of the second PMOS transistor corresponds to an output end of the first current source, a gate electrode of the second PMOS transistor is connected with the node A,
   and wherein the second current source is composed as a second NMOS transistor, a drain electrode of the second NMOS transistor corresponds to an input end of the second current source, a source electrode of the second PMOS transistor corresponds to an output end of the second current source, and a gate electrode of the second NMOS transistor is connected with the node A.

4. A Colpitts voltage-controlled oscillator comprising:
   a first PMOS transistor and a first NMOS transistor connected complementarily;
   a first transformer having one end of a primary winding thereof connected with a gate electrode of the first PMOS transistor, having one end of a secondary winding thereof connected with a drain electrode of the first PMOS transistor, and having the other end of the primary winding thereof and the other end of the secondary winding thereof connected with a node A corresponding to an AC ground; and
   a second transformer having one end of a primary winding thereof connected with a gate electrode of the first NMOS transistor, having one end of a secondary winding thereof connected with a drain electrode of the first NMOS transistor, and having the other end of the primary winding thereof and the other end of the secondary winding thereof connected with the node A.

5. The Colpitts voltage-controlled oscillator of claim 4, further comprising:
   a first current source connected with a source electrode of the first PMOS transistor and configured to supply a current;
   a second current source connected with a source electrode of the second PMOS transistor and configured to supply a current;
   a first capacitor having one end thereof connected with an input end of the first current source and having the other end thereof connected with an output end of the first current source and a source electrode of the first PMOS transistor;
   a second capacitor having one end thereof connected with the output end of the first current source, the source electrode of the first PMOS transistor, and the other end of the first capacitor, and having the other end thereof connected with a drain electrode of the PMOS transistor and the one end of the secondary winding of the first transformer;
   a third capacitor having one end thereof connected with the drain electrode of the first NMOS transistor and the other end of the secondary winding of the second transformer, and having the other end thereof connected with an input end of the second current source and a source electrode of the first NMOS transistor; and
   a fourth capacitor having one end thereof connected with an input end of the second current source, the source electrode of the first NMOS transistor, and the other end of the third capacitor, and having the other end thereof connected with an output end of the second current source.

* * * * *